(12) United States Patent
Nagaosa et al.

(10) Patent No.: US 9,741,420 B2
(45) Date of Patent: Aug. 22, 2017

(54) SKYRMION DRIVING METHOD AND DRIVING APPARATUS

(71) Applicants: RIKEN, Saitama (JP); University of Cologne, Cologne (DE)

(72) Inventors: Naoto Nagaosa, Tokyo (JP); Achim Rosch, Cologne (DE); Christoph Schuette, Cologne (DE)

(73) Assignees: RIKEN, Saitama (JP); University of Cologne, Cologne (DE)

( * ) Notice: Subject to any disclaimer, the term of this patent is extended or adjusted under 35 U.S.C. 154(b) by 0 days.

(21) Appl. No.: 15/232,811

(22) Filed: Aug. 10, 2016

(65) Prior Publication Data

US 2016/0351242 A1    Dec. 1, 2016

Related U.S. Application Data

(63) Continuation of application No. PCT/JP2014/000697, filed on Feb. 10, 2014, and a continuation of application No. PCT/JP2014/080266, filed on Nov. 14, 2014.

(51) Int. Cl.
| | |
|---|---|
| *H03B 1/00* | (2006.01) |
| *H03K 3/00* | (2006.01) |
| *G11C 11/16* | (2006.01) |
| *G11C 11/18* | (2006.01) |
| *H01L 43/02* | (2006.01) |

(52) U.S. Cl.
CPC .......... *G11C 11/1693* (2013.01); *G11C 11/16* (2013.01); *G11C 11/1675* (2013.01); *G11C 11/18* (2013.01); *H01L 43/02* (2013.01)

(58) Field of Classification Search
CPC . G11C 11/1693; G11C 11/16; G11C 11/1675; G11C 11/18

USPC .... 327/108–112, 427, 434, 437; 326/82, 83, 326/87

See application file for complete search history.

(56) References Cited

U.S. PATENT DOCUMENTS

| | | | |
|---|---|---|---|
| 2011/0261602 A1* | 10/2011 | Moutafis ................ | B82Y 10/00 365/8 |
| 2017/0018297 A1* | 1/2017 | Zang .................... | G11C 11/1675 |
| 2017/0033742 A1* | 2/2017 | Akerman ............. | H03B 15/006 |

OTHER PUBLICATIONS

Yu, X. Z. et al. Near room-temperature formation of a skyrmion crystal in thin-films of the helimagnet FeGe. Nat. Mat. 10, 106-109 (2011).
Junichi Iwasaki et al. Universal current-velocity relation of skyrmion motion in chiral magnets. Nature communications, vol. 4:1463, Feb. 2013.
Garcia-Palacios, J. L. et al. Langevin-dynamics study of the dynamical properties of small magnetic particles. Phys. Rev. B 58, 14937-14958 (1998).

(Continued)

*Primary Examiner* — Thomas Skibinski

(57) ABSTRACT

A skyrmion driving method that utilizes electric current to make it possible to perform driving ON-OFF control at high speed and to suppress the influence of an inertial effect so that the driving control can be performed further logically. The skyrmion is driven based on a driving amount proportional to a time-integrated value of an electric current density $j(t)$ ($Am^{-2}$) at a clock time t for a location $R(t)$ of the skyrmion at the clock time t and on a driving amount that is in accordance with a diffusive motion due to thermal fluctuation and increases as a Gilbert attenuation constant increases.

6 Claims, 7 Drawing Sheets

(56) References Cited

OTHER PUBLICATIONS

Thiele, A. A. Steady-state motion of magnetic domains. Phys. Rev. Lett. 30, 230-233 (1973).
Kubo, R. The fluctuation-dissipation theorem. Rep. Prog. Phys. 29, 255-284(1966).

* cited by examiner

SKYRMION DRIVING METHOD AND DRIVING APPARATUS

The contents of the following Japanese patent application(s) are incorporated herein by reference:
PCT/JP2014/000697 filed on Feb. 10, 2014, and
PCT/JP2014/080266 filed on Nov. 14, 2014.

BACKGROUND

1. Technical Field

The present invention relates to a skyrmion driving method and driving apparatus that utilize electric current to make it possible to perform driving ON-OFF control at high speed and to suppress the influence of an inertial effect so that the driving control can be performed further logically.

2. Related Art

In conventional semiconductor electronics, among two properties of electrons which are electric charges and spins, focus has been mostly given to utilization of electric charges. On the other hand, spintronics that actively utilizes the other property of electrons, spins, is also an electron technique that has been of particular interest these years, and is highly expected to provide next-generation devices having innovative features/functions.

Spins of electrons generally are largely related to magnetic behaviors of a material, and when spins align in the same direction, the material shows normal properties as a magnetic body. In contrast, it has been made clear that in some special magnetic bodies, spins of electrons voluntarily form a structure called a skyrmion.

A skyrmion is a topological magnetic structure in which the order of spins generated in a material shows a spiral array. A skyrmion has a very stable structure without any breakage even when continuous changes have occurred to spins.

In this manner, a structure in which a skyrmion is regularly arrayed in a grid under a magnetic field at a certain temperature is called a skyrmion crystal, which was found through analysis of B20-type MnSi by utilizing a small angle neutron beam diffraction method. A skyrmion crystal can be observed directly through observation of a B20-type alloy by utilizing a Lorentz transmission electron microscopy (TEM).

Because the size of a skyrmion is approximately 3 to 100 nm in diameter, a skyrmion is expected to provide next-generation spintronics device having a high information density.

Also, a skyrmion shows characteristics which are excellent from the engineering perspective because it allows control of a magnetic structural body with micro-electric current whose magnitude is as small as approximately 1/100000 as compared with a magnetic domain wall in a ferromagnetic body.

Also, a skyrmion generated in a crystal has a property of functioning as an effective magnetic flux through the quantum-mechanical Berry phase for electrons. Because of this, it can be known that the topological Hall effect occurs to a skyrmion crystal.

Furthermore, a skyrmion crystal also shows other interesting properties. For example, exemplary properties include that a skyrmion shows a behavior little influenced by the pinning effect at a very low power density ($<100\,\mathrm{Acm}^{-2}$), and that electric polarization occurs due to a skyrmion in an insulator.

Because a skyrmion has numerous peculiar properties like these, it is expected to be applied to highly dense, power-saving data devices and applied to arithmetic operation devices. Also, because by having a special spin array, a skyrmion has a property as particles, and is configured in nanometer sizes, it is expected to be applied for recording bits in high speed, power-saving magnetic memory elements.

When utilizing a skyrmion having such properties as an information carrier, it is required to control driving of it.

PRIOR ART DOCUMENTS

[Non-Patent Document 1] Yu, X. Z. et al. Near room temperature formation of a skyrmion crystal thinfilms of the helimagnet FeGe. Nat. Mat. 10, 106-109(2011).

[Non-Patent Document 2] Junichi Iwasaki et al. Universal electric current-velocity relation of skyrmions motion in chiral magnets. Nature communications, vol. 4:1463, February 2013.

[Non-Patent Document 3] Garcia-Palacios, J. L. et al. Langevin-dynamics study of the dynamical properties of small magnetic particles. Phys. Rev. B 58, 14937-14958 (1998).

[Non-Patent Document 4] Thiele, A. A. Steady-state motion of magnetic domains. Phys. Rev. Lett. 30, 230-233 (1973)

[Non-Patent Document 5] Kubo, R. The fluctuation-dissipation theorem. Rep. Prog. Phys. 29, 255-284(1966)

Meanwhile, there are two types of methods for driving a skyrmion: one method utilizes magnetic field gradient for driving and the other method utilizes electric current for driving.

Among them, in the driving by utilizing magnetic field gradient, the influence of an inertial force manifests itself significantly, and also driving ON-OFF control cannot be performed at high speed.

On the other hand, in the driving by utilizing electric current, although unlike the driving by utilizing magnetic field gradient, the influence of an inertial force can be suppressed, and driving ON-OFF control can be performed at high speed, an urgent issue is how to logically realize a method for controlling the driving.

The present invention was made in view of the above-mentioned drawbacks, and an object of the present invention is to provide a skyrmion driving method that utilizes electric current to make it possible to perform driving ON-OFF control at high speed and to suppress the influence of an inertial effect so that the driving control can be performed further logically.

SUMMARY

The skyrmion driving method and apparatus according to the present invention is a skyrmion driving method and apparatus that utilize electric current to drive a skyrmion, wherein the skyrmion is driven based on a driving amount proportional to a time-integrated value of an electric current density for a location R(t) of the skyrmion at a clock time t and on a driving amount that is in accordance with a diffusive motion due to thermal fluctuation and decreases as a Gilbert attenuation constant decreases.

The driving amount proportional to the electric current may be expressed by Equation 1 and the driving amount of a diffusive motion due to thermal fluctuation may be expressed by Equation 2.

$$R(t) - R(0) = \eta \int_0^t dt'\, j(t') \qquad \text{[Equation 1]}$$

-continued $$\langle (R(t) - R(0))^2 \rangle \approx (t/sec)\left(10^{-7}\frac{\alpha k_B T}{J}\right)[m^2]$$ [Equation 2]

Here, j(t) is an electric current density ($Am^{-2}$) at a clock time t, R(0) is a location at a clock time 0, $\alpha$ is a Gilbert attenuation constant, $k_B$ is a Boltzmann's constant, T is a temperature (Fahrenheit), J is an exchange interaction constant, and $\eta$ is a constant that associates an electric current density with a speed, and gives the value of approximately 1 $msec^{-1}$ for $j=10^{10}$ $Am^{-2}$. Also, (t/sec) indicates the length of time in the unit of seconds.

The skyrmion may be driven by utilizing electric current at time intervals that are shorter than time intervals required for a diffusive motion of the skyrmion due to the thermal fluctuation.

Effects of the Invention

According to the present invention having the above-mentioned configurations, electric current is utilized to make it possible to perform skyrmion driving ON-OFF control at high speed and to suppress the influence of an inertial effect so that the driving control can be performed further logically.

DESCRIPTION OF EXEMPLARY EMBODIMENTS

Hereinafter, a skyrmion driving method and apparatus as embodiments of the present invention are explained in detail.

A skyrmion exists stably in a chiral crystal, and is mainly generated in a hexagonal lattice (in some cases, a square lattice or a simple cubic lattice). Such a magnetically ordered state is called a skyrmion crystal.

Figure 1:
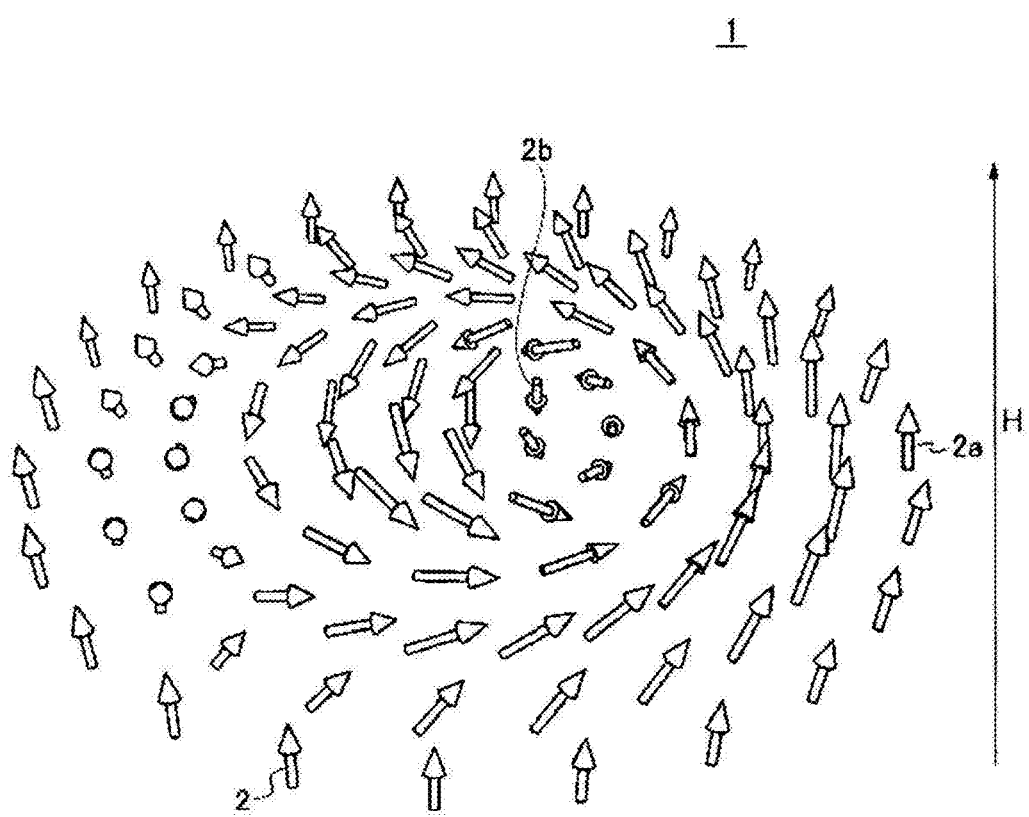
FIG. 1 is a schematic view showing a skyrmion.

FIG. 1 is a schematic view showing a skyrmion. The skyrmion shown schematically in FIG. 1 has a spiral spin structure, and the spins point in all the directions wrapping a sphere. The sign of the phase in this state is −1.

The skyrmion 1 is configured with spins 2 that point in all the directions. When the direction of a magnetic field H applied to the skyrmion 1 is upward in the figure, circumferentially outermost spins 2a are oriented upward similar to the direction of the magnetic field H and parallel with the magnetic field H.

The skyrmion 1 has a planar form where it rotates inward from its outermost circumference in a swirling manner, and along with this, the directions of the spins 2 change their orientations gradually. Spins 2b that configure the center of the skyrmion 1 are oriented downward so as to be antiparallel with the magnetic field H, and are stabilized in this state.

The directions of the spins 2 of the skyrmion 1 show continuous transition from the downward orientation to the upward orientation from its center to its outermost circumference, and the skyrmion 1 has a structure where it is regularly arranged. The skyrmion 1 has a structure where a plurality of electron spins are regularly arranged like a spiral.

The orientations of the central spins 2b and circumferentially outermost spins 2a are antiparallel with each other, and the orientations of the spins 2 between the center and the outer circumference twist continuously, forming a swirling structure.

By irradiating such a skyrmion 1 with an electromagnetic wave at a specific frequency for example, it is possible to cause magnetic resonance of the skyrmion, which will in turn lead to motion, e.g., clockwise rotation or counterclockwise rotation, of the skyrmion.

Figure 2:
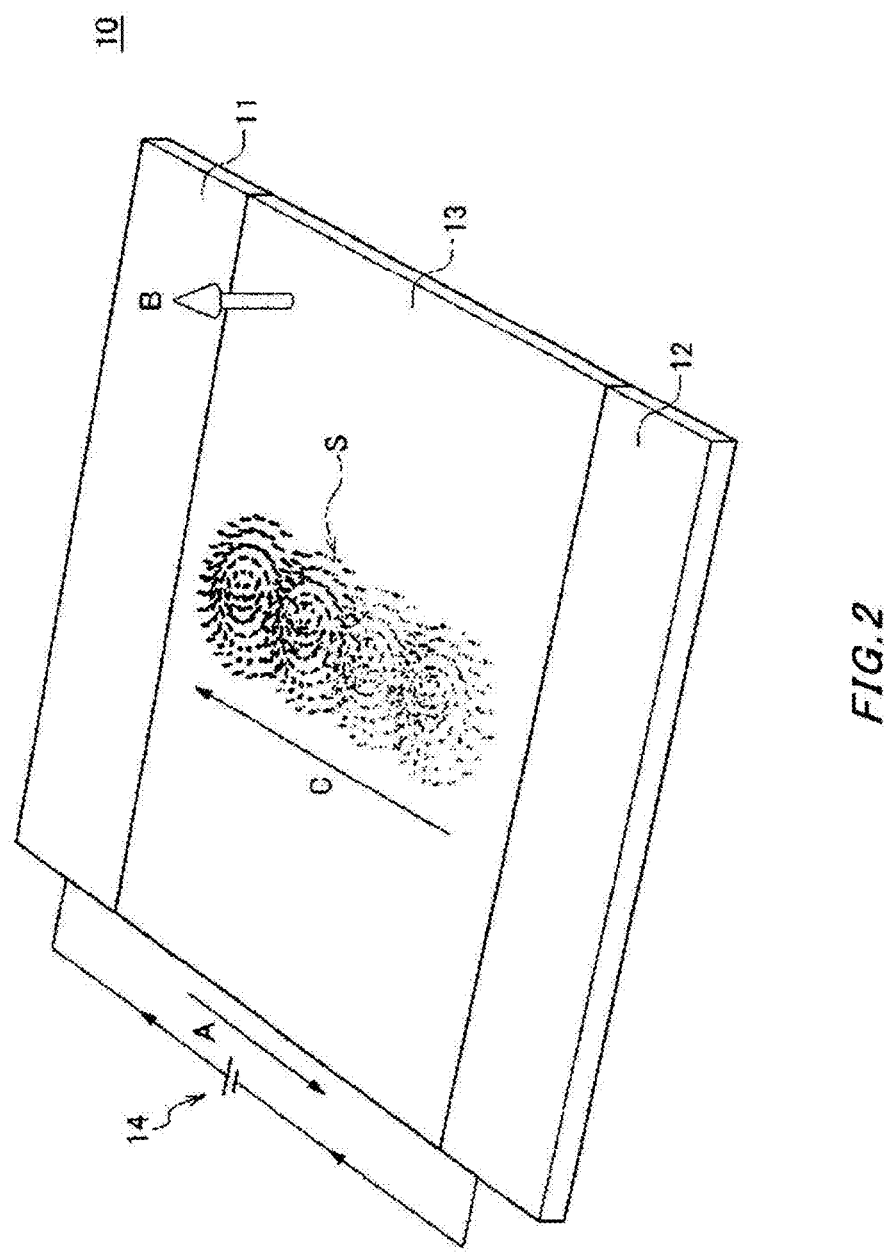
FIG. 2 is a schematic view showing a magnetic element that enables transfer of a skyrmion.

FIG. 2 is a schematic view showing a magnetic element 10 that enables transfer of a skyrmion. The magnetic element 10 is an element formed to be thin-layer-like with a thickness of 500 nm or less, and is formed by utilizing a technique such as MBE (Molecular Beam Epitaxy) or sputtering.

The magnetic element 10 is configured comprising: a thin-plate like magnetic body 13 consisting of a chiral magnetic body; an upstream side non-magnetic metal 11 which is a conductor connected to an end portion, in the spreading direction, of the magnetic body 13; and a downstream side non-magnetic metal 12 which is a conductor connected to the magnetic body 13 at an end portion opposite to the upstream side non-magnetic metal 11.

The magnetic body 13 is a chiral magnetic body, and is made of FeGe, MnSi or the like. The chiral magnetic body is a magnetic body whose spin arrangement at the time when there is no magnetic field application rotates helically along a certain direction.

The upstream side non-magnetic metal 11 and the downstream side non-magnetic metal 12 are made of conductive non-magnetic metals such as Cu, W, Ti, TiN, Al, Pt or Au. The downstream side non-magnetic metal 12 is connected to the magnetic body 13 in its spreading direction.

When a skyrmion is to be generated and transferred by utilizing this magnetic element 10, a power source 14 is connected to the upstream side non-magnetic metal 11 and the downstream side non-magnetic metal 12, and a magnetic field generating unit is provided to the magnetic body 13 on its lower surface side in FIG. 2. The power source 14 functions as a driving apparatus that drives a skyrmion. The driving apparatus may be provided with a control unit that controls the power source 14. The control unit drives the skyrmion by controlling the power source 14 based on a driving amount proportional to a time-integrated value of an electric current density for a location R(t) of the skyrmion at a clock time t and on a driving amount that is in accordance with a diffusive motion due to thermal fluctuation and decreases as the Gilbert attenuation constant decreases. For example, the control unit controls the power source 14 based on Equation 4 and Equation 6 that are described later.

Upon application of a magnetic field from the magnetic field generating unit to the magnetic element 10 in the direction of an arrow B, a skyrmion S is generated.

Next, upon application of electric current from the power source 14 to the upstream side non-magnetic metal 11, electric current flows in the direction of an arrow A in FIG. 2, that is, from the upstream side non-magnetic metal 11 through the magnetic body 13 to the downstream side non-magnetic metal 12.

Upon application of the electric current to the magnetic element 10 in the direction of the arrow A, electrons flow in the direction opposite to the arrow A. Then, the skyrmion S in the magnetic element 10 moves along the flow of the electrons in the direction indicated by an arrow C, that is, in the direction opposite to the direction indicated by the arrow A.

Figure 3A:
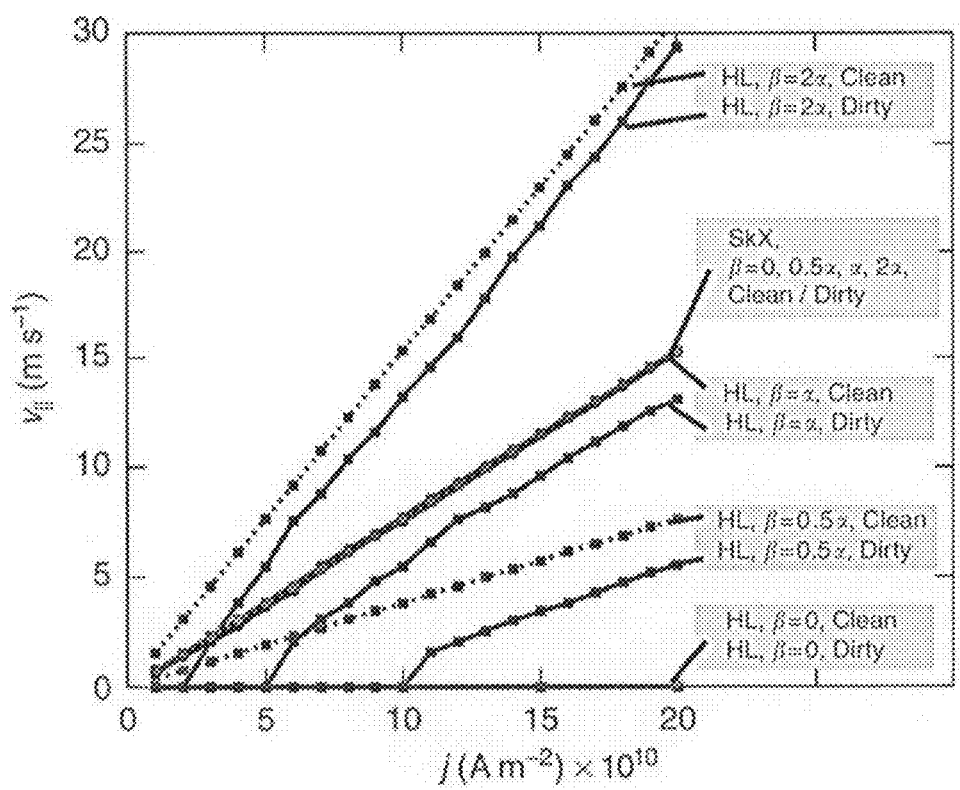
FIG. 3A shows a relation between electric current and speed of a magnetic structure in a helical magnetic phase (HL) and a skyrmion crystal phase (SkX).
Figure 3B:
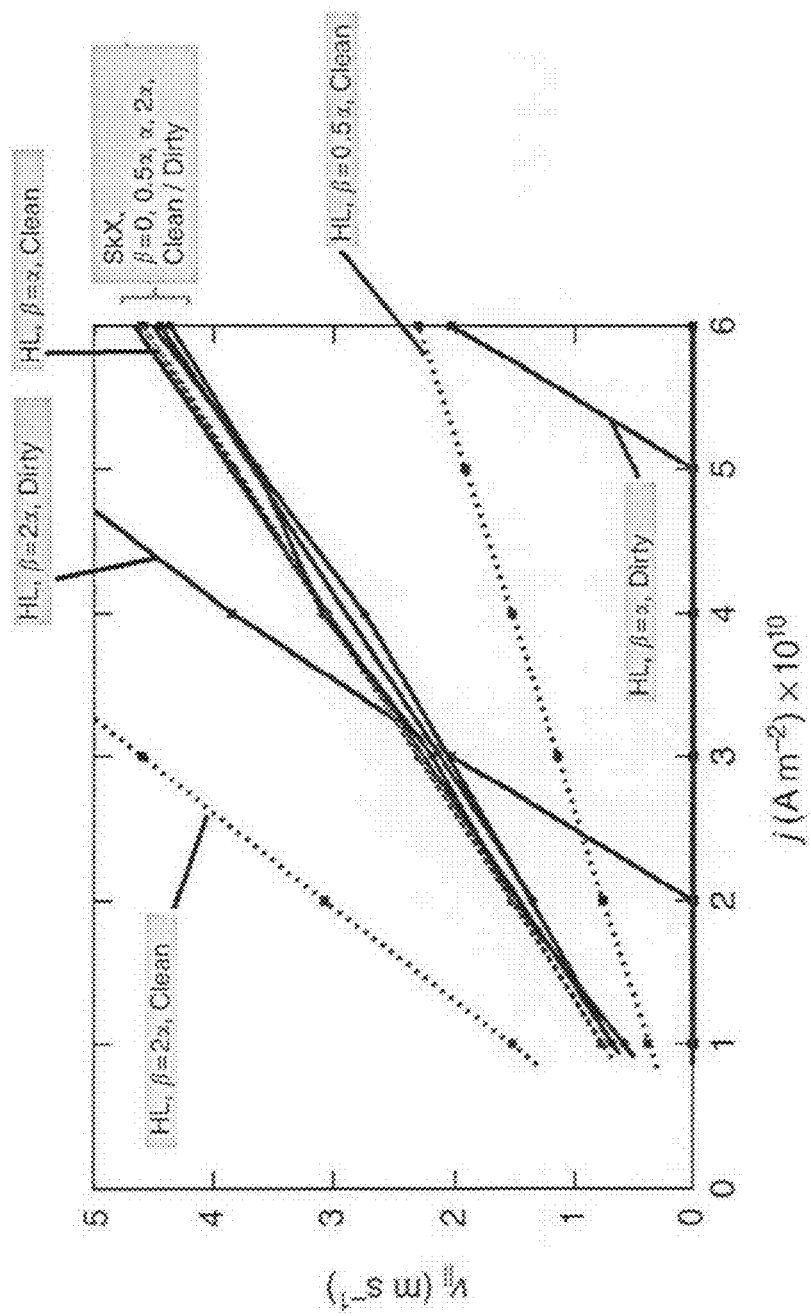
FIG. 3B is a partially enlarged view of FIG. 3A.

FIG. 3A is a figure showing a relation between electric current flowing through the magnetic body 13 and speed of a magnetic structural body such as a skyrmion in the direction parallel with the electric current. FIG. 3B is an enlarged view obtained by enlarging a low electric current portion in FIG. 3A. The relation shown in FIG. 3A and FIG. 3B is obtained through simulation by utilizing the Landau-Lifshitz-Gilbert equation (LLG equation) that describes motion of a magnetization vector in a magnetic field, as shown in Non-Patent Document 2. The magnetic body 13 shows transition to its helical magnetic phase (HL), skyrmion crystal phase (SkX) and ferromagnetic phase (FM) depending on the magnitude of an applied external magnetic field B as shown in FIG. 1 of Non-Patent Document 2, for example.

FIG. 3A and FIG. 3B show a relation between electric current and speed of a magnetic structure in a helical magnetic phase (HL) and a skyrmion crystal phase (SkX). In FIG. 3A and FIG. 3B, β is a constant indicating the degree of coupling between electric current and local magnetization. Also, "Clean" corresponds to a case where the magnetic body 13 does not contain impurities, and "Dirty" corresponds to a case where the magnetic body 13 contains 0.1% of impurities.

As shown in FIG. 3A and FIG. 3B, the relation between electric current and speed in the skyrmion crystal phase is approximately linear from a low electric current density to a high electric current density irrespective of the Gilbert attenuation constant α, the degree of coupling β and the impurity concentration. That is, the speed of a skyrmion in the skyrmion crystal phase is proportional to electric current. As shown in Non-Patent Document 2, the relation between speed and electric current of a magnetic structure is expressed by the following equation.

$$v=(pa^3/2eM)j \qquad \text{[Equation 3]}$$

where p is spin polarization of conduction electrons, a is a lattice constant of the magnetic body 13, e is an electric charge of electrons, M is the magnitude of magnetic moment, and j is electric current.

If a skyrmion is to be driven by using the magnetic element 10 by utilizing electric current, the location (driving amount) R(t) of the skyrmion with respect to the common time-dependent electric current density j(t) (Am$^{-2}$) is expressed by the following [Equation 4] by integrating Equation 3, for example, although [Equation 4] includes slight tolerance.

$$R(t)-R(0)=\eta \int_0^t dt'\, j(t') \qquad \text{[Equation 4]}$$

where η is a constant that associates electric current density with speed, is given by Equation 3, for example, and gives the value of approximately 1 msec$^{-1}$ for j=10$^{10}$ Am$^{-2}$.

The above-mentioned [Equation 4] indicates that the integrated value of the electric current density j(t) and the driving amount R(t) are proportional to each other. That is, it can be known that the larger the integrated value of the electric current density j(t) is, the larger the driving amount R(t) is in proportion thereto.

It has been ascertained through numerical simulation shown in FIG. 3A and FIG. 3B that this [Equation 4] holds true accurately at least to picosecond-scale temporal changes.

Also, the above-mentioned [Equation 4] does not include, as its parameters, the size of a skyrmion. That is, if a skyrmion is to be driven by utilizing electric current, the driving is not affected by an inertial force that increases in proportion to the size.

Figure 4:
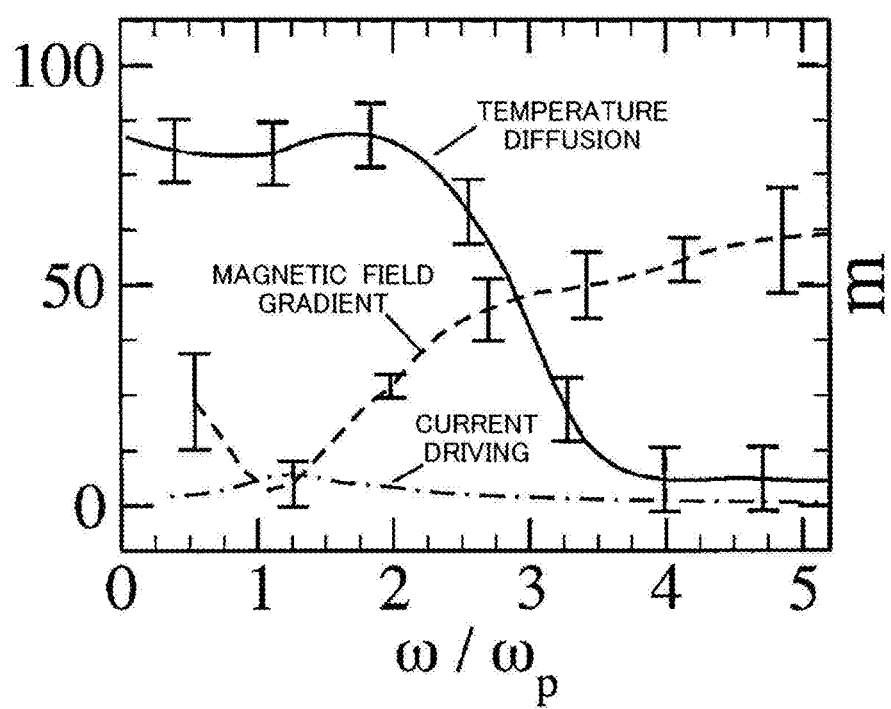
FIG. 4 is a figure showing simulation results about the frequency-dependence of the inertial mass m of a skyrmion.

FIG. 4 is a figure showing simulation results about the frequency-dependence of an inertial mass m of a skyrmion. FIG. 4 shows the inertial mass of a skyrmion in electric current driving, the inertial mass of a skyrmion in magnetic field gradient driving, and the inertial mass of a skyrmion in temperature diffusion. As shown in FIG. 4, the inertial mass of a skyrmion in electric current driving is almost 0 and is negligible irrespective of the frequency of electric current. Accordingly, in the electric current driving, a skyrmion is not affected by inertial force.

Here, it has been known that the critical electric current density for driving a skyrmion is approximately 10$^6$ Am$^{-2}$. The power source 14 drives a skyrmion by utilizing electric current with magnitude equal to or higher than the critical electric current density. As described above, the movement velocity of a skyrmion for j=10$^{10}$ Am$^{-2}$ is approximately 1 msec$^{-1}$. Therefore, assuming that the size of a skyrmion is 10 nm in diameter, which is characteristic of them, the length of time required for ensuring a movement amount which approximately equals the magnitude is 10 μseconds for j=10$^7$ Am$^{-2}$, and 0.1 μseconds for j=10$^9$ Am$^{-2}$. That is, because when j=10$^7$ Am$^{-2}$, the movement velocity of a skyrmion is (10$^7$/10$^{10}$) msec$^{-1}$, the length of time required for movement by 10 nm is 10 nm/10$^{-3}$/sec=10$^{-5}$ sec. Similarly, when j=10$^9$ Am$^{-2}$, 10 nm/10$^{-1}$/sec=10$^{-7}$ sec.

Note that the minimum size of a skyrmion is restricted so as to avoid situations where it interferes with the periodic potential of a crystal and cannot be driven.

For example, a skyrmion occurring in a MnSi-based crystal can be formed to have a minimum size of approximately 3 nm in diameter, and a maximum size of approximately 18 nm. Also, a skyrmion can be formed in a FeCoSi-based crystal to have a maximum size of approximately 50 nm.

In this manner, the range of sizes that a skyrmion can have is respectively determined according to the material of a crystal.

When application of electric current is stopped, a skyrmion stops its motion without being affected by an inertial effect, and becomes stationary at its location.

On the other hand, a skyrmion shows a diffusive motion due to thermal fluctuation. Generally, the mean square of a diffusion distance of particles is expressed by the following equation by using a diffusion constant D that is dependent on the Gilbert attenuation constant α.

$$\langle (R(t)-R(0))^2 \rangle = 2Dt \qquad \text{[Equation 5]}$$

Figure 5:
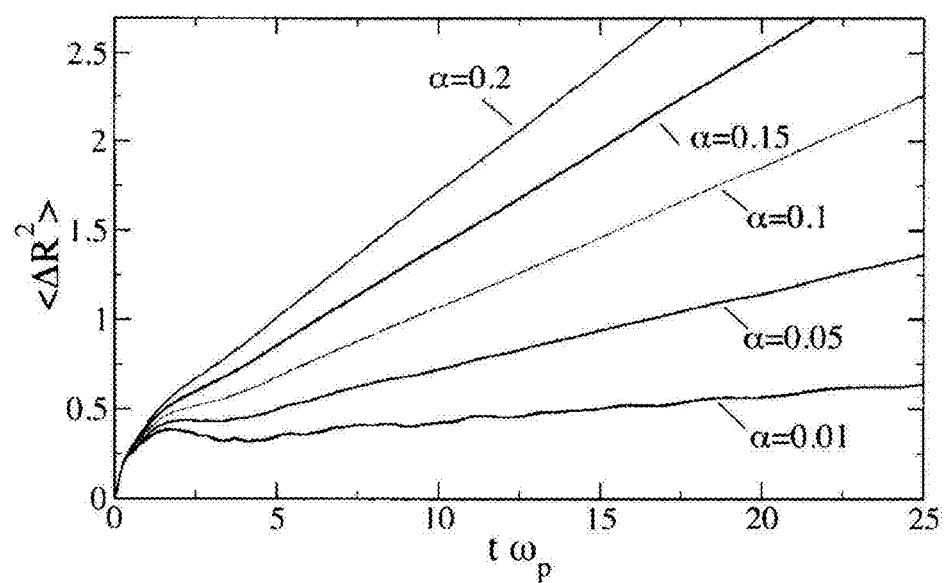
FIG. 5 is a figure showing simulation results about the time-dependence of the mean square of the diffusion distance $\Delta R$ due to thermal fluctuation of a skyrmion.

FIG. 5 is a figure showing simulation results about the time-dependence of the mean square of the diffusion distance ΔR due to thermal fluctuation of a skyrmion. In the present example, the reference temperature is T=0.1 Tc. Also, simulation was respectively performed for the Gilbert attenuation constant α of 0.01, 0.05, 0.1, 0.15 and 0.2. ωp in the horizontal axis indicates the frequency of a precession of electron spins in the ferromagnetic phase.

As shown in FIG. 5, diffusion due to thermal fluctuation of a skyrmion is significantly suppressed by the Gilbert attenuation constant α. Based on calculation in the simulation shown in FIG. 5, assuming that J is an exchange interaction constant which is a value approximately equal to a transition temperature Tc of the helical magnetic body multiplied by the Boltzmann's constant, T is a temperature (Fahrenheit), and $k_B$ is the Boltzmann's constant, the motion amount due to thermal fluctuation between the clock times 0 to t can be expressed by the following [Equation 6]. (t/sec) represents the length of time expressed in the unit of seconds.

$$\langle (R(t) - R(0))^2 \rangle \approx (t/sec) \left( 10^{-7} \frac{\alpha k_B T}{J} \right) [m^2] \quad \text{[Equation 6]}$$

Here, if α=0.01, T=0.1 Tc and the size (diameter) of a skyrmion is 10 nm, the length of time required for a skyrmion with this size to show a diffusive motion is approximately 5 μseconds. Here, the length of time required for a skyrmion to show a diffusive motion refers to the length of time required for the skyrmion to show a diffusive motion by the distance accuracy required for locational control of the skyrmion. In the above-mentioned example, it refers to the length of time required for a skyrmion to show a diffusive motion by the size (diameter) of the skyrmion. The length of the distance may be changed according to the required accuracy. For example, the distance may be half of the size of a skyrmion.

For this reason, by driving a skyrmion at time intervals that are shorter than this length of time, it is possible to prevent the location of a skyrmion from becoming instable due to thermal diffusion. For example, if a skyrmion is to be driven by utilizing electric current pulses, it is possible to stabilize the location of the skyrmion by making intervals of electric current pulses shorter than the time intervals.

Next, details of the numerical simulation shown in FIG. 4, FIG. 5 and the like are explained.

(Model of Numerical Simulation)

Motion of a magnetic structural body due to electric current, magnetic field gradient and temperature variation is described by the following equation of motion.

$$G^{-1}(\omega) V(\omega) = F_c(\omega) + F_g(\omega) + F_{th}(\omega) \quad \text{[Equation 7]}$$

$$= S_c(\omega) v_s(\omega) + S_g(\omega) \nabla B_z(\omega) + F_{th}(\omega)$$

Here, $G^{-1}(\omega)$ is a matrix defining behavior of a skyrmion, $V(\omega) = \int e^{i\omega t} R(t) dt$ is the Fourier transform of speed of a skyrmion, $F_c(\omega)$ is a force generated by electric current, $F_g(\omega)$ is a force generated by magnetic field gradient, $F_{th}(\omega)$ is a force generated by temperature variation, $v_s(\omega)$ is a speed of drift of conduction electrons proportional to the electric current, $\nabla Bz(\omega)$ is the magnetic field gradient in the frequency space.

Also, motion of a skyrmion S conforms to the following stochastic Landau-Lifshitz-Gilbert equation (see, for example, Non-Patent Document 3) describing motion of magnetization vectors in a magnetic field.

$$\frac{dM_r}{dt} = \gamma M_r \times [B_{eff} + b_{fl}(t)] - \gamma \frac{\alpha}{M} M_r \times (M_r \times [B_{eff} + b_{fl}(t)]). \quad \text{[Equation 8]}$$

Here, Mr is a local magnetic moment, γ is a gyro magnetic moment, $B_{eff}$ is an effective magnetic field formed by surrounding magnetic moments ($B_{eff} = -\delta H[M]/\delta Mr$), and $b_{fl}(t)$ is a stochastic field that generates a random torque in magnetic moments for modelling the effect of temperature variation. Also, the Hamiltonian H[M] of the skyrmion S is expressed by the following equation.

$$H[M] = -J \sum_r M_r \cdot (M_{r+ae_x} + M_{r+ae_y}) - \quad \text{[Equation 9]}$$

$$\lambda \sum_r (M_r \times M_{r+ae_x} \cdot e_x + M_r \times M_{r+ae_y} \cdot e_y) - B \cdot \sum_r M_r$$

Here, $e_x$ and $e_y$ are unit vectors in the x- and y-directions in the xy plane parallel with a surface of the magnetic body 13, $M_{r+ae_x}$ and $M_{r+ae_y}$ are magnetic moments at locations that are different by an a-fold length of a unit vector in the x- and y-directions relative to $M_r$, γ is a constant indicating the magnitude of the Dzyaloshinskii-Moriya interaction, and B is an external magnetic field applied to the magnetic body 13.

Also, in the numerical simulation, J=1, γ=1, $|M_r|$=1, λ=0.18 J, B(x, y, z)=(0, 0, 0.0278 J), and the diameter of a skyrmion is 15-fold of the lattice constant of the magnetic body 13.

Also, in accordance with Non-Patent Document 3, $b_{fl}(t)$ was assumed to be as follows.

$$\langle b_{r,i}^{fl}(t) \rangle = 0 \quad \text{[Equation 10]}$$

$$\langle b_{r,i}^{fl}(t) b_{r',j}^{fl}(s) \rangle = 2\alpha \frac{k_B T}{\gamma M} \delta_{ij} \delta_{rr'} \delta(t-s)$$

Here, i and j are orthogonal components, and the operator < . . . > indicates an average. t and s represent lengths of time, r and r' are spatial coordinate vectors, $\delta_{ij}$ is a Kroneckers's symbol which is 1 when i and j are equal to each other and otherwise is 0, $\delta_{rr'}$ is similarly a symbol which is 1 when the vectors r and r' are equal to each other, and δ(t-s) indicates the Dirac delta function which is infinite only when t=s, and otherwise is 0.

For numerical analysis of Equation 8, Non-Patent Document 3 and the Heun scheme were used. A drift velocity of a skyrmion can be calculated from the Thiele's equation shown in Non-Patent Document 4, for example. The following equation is obtained from the sLLG equation of Equation 8.

$G = hM_0 \int dr \, n \cdot (\partial_x n \times \partial_y n)$ $D = hM_0 \int dr (\partial_x n \cdot \partial_x n | \partial_y n \cdot \partial_y n)/2$ $F_c = G \times v_s + \beta D v_s$ $F_g = M_s \nabla B_c \, M_s = M_0 \int dr (1-n_z) \quad \text{[Equation 11a]}$ Here, n is a vector indicating the direction of magnetization, $M_0$ is local magnetization, $v_s$ is a drift velocity of conduction electrons, and $M_s$ indicates a change in magnetization induced by a skyrmion in the ferromagnetic phase. Also, gyro coupling=$(0, 0, G)^T$, and G=±$hM_0 4\pi$ (where h is a reduced Planck constant). In the present specification, these equations are analyzed numerically, and behavior of a skyrmion was simulated.

Equation 11a is obtained by deriving a Lagrangian equation of motion for a center-of-gravity location R(t) of a skyrmion assuming that the form $M_0(r)$ of the skyrmion remains unchanged and only R(t) changes as shown in Non-Patent Document 4.

$$\overline{M_r} = \overline{M_0}(\vec{r} - \vec{R}(t))$$ [Equation 11b]

(Diffusion Due To Temperature)

The orbit R(t) of a skyrmion due to random forces caused by temperature variation was calculated through numerical simulation based on the sLLG equation of Equation 8. Also, for data analysis, the Kubo's fluctuation-dissipation theorem shown in Non-Patent Document 5 was used, for example.

For $F_{th}$ of Equation 7, the following equation is generally obtained.

$$\langle F_{th}^i(\omega) F_{th}^j(\omega') \rangle = k_B T [G_{ij}^{-1}(\omega) + G_{ji}^{-1}(-\omega)] 2\pi \delta(\omega + \omega')$$ [Equation 12]

Here, $$G_{ij}(\omega) = \frac{1}{k_B T} \int_0^\infty \ominus (t-t') \langle \dot{R}_i(t) \dot{R}_j(t') \rangle e^{i\omega(t-t')} d(t-t')$$

Here, $F^i_{th}$ is the thermal fluctuation force in the i-direction, $F^j_{th}$ indicates the thermal fluctuation force in the j-direction, and $G^{-1}_{ij}$ and $G^{-1}_{ji}$ indicate the ij component and ji component of a matrix $G^{-1}(\omega)$ in Equation 31 described later.

When the frequency $\omega$ is low, $$<F_{th}^x(\omega)F_{th}^x(\omega')>=4\pi k_B T \alpha D \delta(\omega+\omega')$$

$$<F_{th}^x(\omega)F_{th}^y(\omega')>=4\pi k_B T \cdot i\omega\alpha\Gamma\delta(\omega+\omega')$$ [Equation 13]

Also, in order to eliminate the influence of electric current and magnetic field gradient, it is assumed that $\nabla B_z = v_s = 0$ in Equation 7. Based on these, the definition of G becomes clear, and diffusion behavior of a skyrmion can be analyzed to obtain the results of FIG. 5.

Normally, the diffusion constant of particles increases as friction decreases. However, conversely, the diffusion constant D of a skyrmion decreases as the Gilbert attenuation constant a decreases. This is due to the gyro coupling term g. The diffusion constant D of a skyrmion is obtained as shown in Equation 14b based on the following stochastic differential equation (Equation 14a). The method of deriving Equation 14b from Equation 14a is described later.

$$G \times \dot{R} + \alpha D \dot{R} + m \ddot{R} + \alpha \Gamma \times \dot{R} = F_c + F_g + F_{th}$$ [Equation 14a]

where R indicates the central coordinate of a skyrmion.

$$D = k_B T \frac{\alpha D}{G^2 + (\alpha D)^2}$$ [Equation 14b]

Equation 6 is derived from Equation 5 and Equation 14b. The method of deriving Equation 6 from Equation 14b is described later.

(Mass m in Electric Current Driving)

The effect of electric current on a magnetic structural body can be modelled by adding the following spin torque term $T_{ST}$ to the right side of the sLLG equation in Equation 8.

$$T_{ST} = -(v_s \cdot \nabla) M_r + \frac{\beta}{M} [M_r \times (v_s \cdot \nabla) M_r]$$ [Equation 15]

The first term on the right side of Equation 15 is called a spin transfer torque term in assumption of adiabaticity. Conduction electrons traverse a magnetic structural body, and adjust the spin orientation of the magnetic structure so as to be parallel with the local magnetic moment $M_r$. The second term called a β term describes dissipative coupling between conduction electrons and a magnetic moment due to the nonadiabatic effect. α and β are dimensionless constants determined according to materials.

Based on the Thiele's approach, following equation is obtained.

$$F_c(\omega \rightarrow 0) = G \times v_s + \beta D v_s$$ [Equation 16]

Also, in the Galilean invariant system, α=β. In this case, the solution of the sLLG equation of Equation 8 is obtained as follows by using the speed $v_s(t)$ of conduction electrons.

$$M(r - \int_{-\infty}^t v_s(t') dt')$$ [Equation 17]

This indicates that the behavior of a skyrmion conforms accurately to electric current. From Equation 7, when α=β, $G^{-1}(\omega) = S_c(\omega)$. Also, $G_a(\omega) S_c(\omega=0) = G(\omega) S_c(\omega)$, and $$G_\alpha^{-1}(\omega) = S_c(\omega=0) = \beta D 1 - i\sigma_y G$$ [Equation 18a]

Under this condition, the effective mass m and the gyro damping are accurately 0.

If α≠β, the sLLG equation predicts a finite mass. Numerically, the following very small mass shown in the example of electric current driving in FIG. 4 was found.

$$m_c^\alpha \propto \alpha - \beta$$ [Equation 18b]

Figure 6:
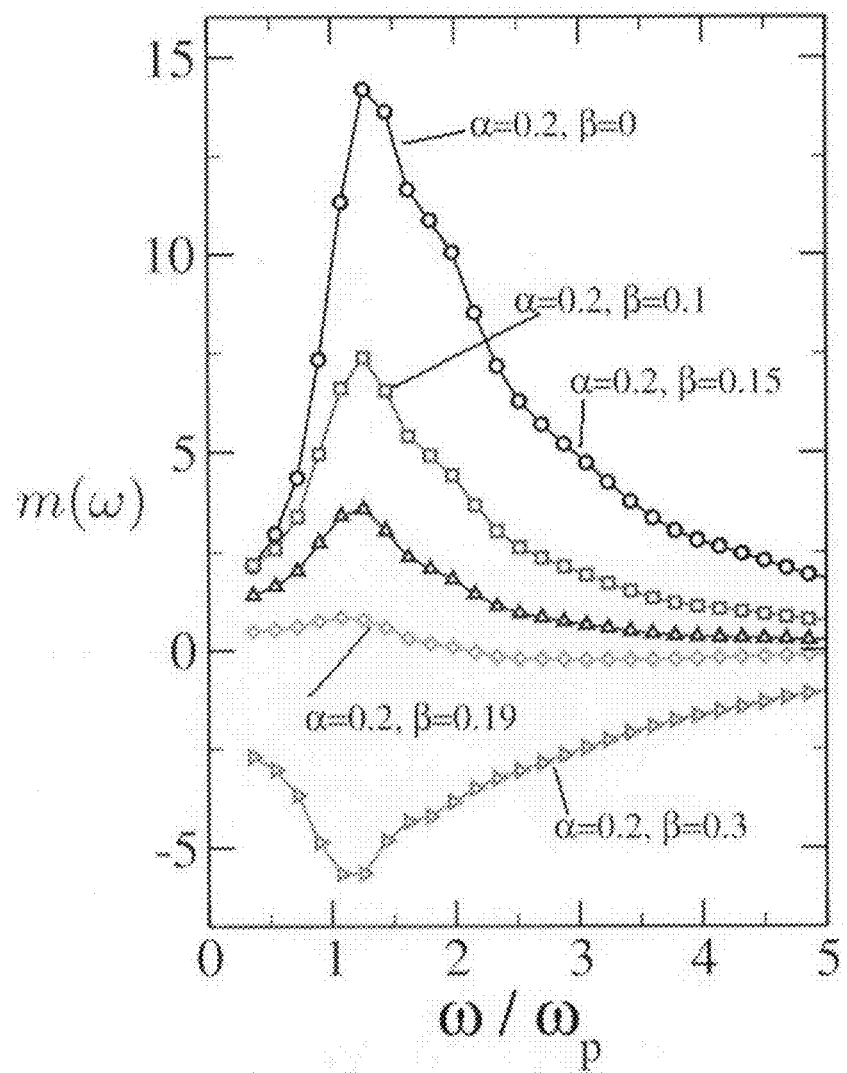
FIG. 6 shows the frequency-dependence of a mass when $\alpha$ and $\beta$ are changed.

FIG. 6 shows the frequency-dependence of a mass when α and β are changed. With any values of α and β, an effective mass smaller than the maximum values of effective masses about magnetic field gradient and temperature diffusion shown in FIG. 4 is obtained. That is, it is shown that even if α≠β, the effective mass of a skyrmion in electric current driving is small, and the location can be controlled accurately by utilizing electric current.

(Deriving Equation 14(b) from Equation 14(a))

First, a method of deriving a diffusive motion from a simple stochastic differential equation is explained.

The following stochastic differential equation is considered.

$$m\dot{v} + m\gamma v = F(t)$$ [Equation 19]

v is a speed of particles, γ is an attenuation coefficient, and F(t) is a drift force and meets the following conditions based on the fluctuation-dissipation theorem.

$$<F(t)>=0$$

$$<F(t)F(t')>=2m\gamma k_B T \delta(t-t')$$ [Equation 20]

Assuming that $$F(\omega) = \int dt e^{i\omega t} F(t)$$ [Equation 21]

$$\langle F(\omega) F(\omega') \rangle = \int dt \int dt' e^{-i\omega t - i\omega' t'} 2\gamma k_B T \delta(t-t')$$ [Equation 22]
$$= 4\pi \gamma k_B T \delta(\omega - \omega')$$

By performing the Fourier transform on Equation 19, the following equation is obtained.

$$(-im\omega + m\gamma) v(\omega) = F(\omega)$$ [Equation 23]

Here, because $$v(\omega) = \frac{F(\omega)}{m(\gamma - i\omega)} \quad \text{[Equation 24]}$$

$$\langle v(\omega)v(\omega')\rangle = \frac{\langle F(\omega)F(\omega')\rangle}{m^2(\gamma - i\omega)(\gamma - i\omega')}$$
$$= \frac{4\pi\gamma k_B T}{m^2(\omega^2 + \gamma^2)}\delta(\omega + \omega') \quad \text{[Equation 25]}$$

Because the distance of movement within the length of time t is $$x(t) = \int_0^t dt' v(t') \quad \text{[Equation 26]}$$

the following equation is obtained.

$$\langle [x(t)]^2 \rangle = \int_0^t dt' \int_0^t dt'' \langle v(t')v(t'')\rangle$$
$$= \int_0^t dt' \int_0^t dt'' \int \frac{d\omega'}{2\pi} \int \frac{d\omega''}{2\pi} e^{-i\omega t' - i\omega t''} \langle v(\omega')v(\omega'')\rangle$$
$$= \int_0^t dt' \int_0^t dt'' \int d\omega' d\omega'' \frac{1}{(2\pi)^2} \frac{4\pi\gamma k_B T m}{(2\pi)^2 m^2(\omega'^2 + \gamma^2)} \delta(\omega' + \omega'') e^{-i\omega'(t'-t'')}$$
$$= \int_0^t dt' \int_0^t dt'' \int d\omega \frac{\gamma k_B T m}{\pi m^2} \frac{e^{-i\omega(t'-t'')}}{\omega^2 + \gamma^2} \quad \leftarrow (A)$$
$$= \int_0^t dt' \int_0^t dt'' \frac{k_B T m}{m^2} e^{-\gamma|t'-t''|}$$

[Equation 27]

Here, because the asymptotic form of $t \to \infty$ is of interest, Equation 27 turns into the following equation, and the diffusion constant D is obtained.

$$\langle [x(t)]^2 \rangle \sim t \int d(t' - t'') \frac{k_B T}{m} e^{-\gamma|t'-t''|} = \frac{2k_B T}{m\gamma} t \quad \text{[Equation 28]}$$
$$= 2Dt$$

$$D = \frac{k_B T}{m\gamma}$$

When in the above-mentioned calculation, the asymptotic form of $t \to \infty$ is to be obtained, integration about t'-t" may be performed at the step (A) of Equation 27. The integration is equivalent to multiplying the integrand with $2\pi\delta(\omega)$. These procedures are also applied to derive Equation 14b from Equation 14a.

Equation 14a is described for each component.

$$-gV_y + \alpha DV_x + mV_x - \alpha\Gamma V_y = F_x(t)$$

$$gV_x + \alpha DV_y + mV_y + \alpha\Gamma V_x = F_y(t) \quad \text{[Equation 29]}$$

Based on the fluctuation-dissipation theorem, the following equation is obtained.

$$\langle F_x(\omega)F_x(\omega')\rangle = 4\pi k_B T\alpha D\delta(\omega+\omega')$$

$$\langle F_x(\omega)F_y(\omega')\rangle = 4\pi k_B T \cdot i\omega\alpha\Gamma\delta(\omega+\omega') \quad \text{[Equation 30]}$$

The Fourier transform is performed on Equation 29.

$$\begin{pmatrix} \alpha'D - im\omega & -h + i\alpha\omega\Gamma \\ g - i\omega\alpha\Gamma & \alpha'D - im\omega \end{pmatrix}\begin{pmatrix} V_x(\omega) \\ V_y(\omega) \end{pmatrix} = \quad \text{[Equation 31]}$$

$$\hat{G}^{-1}(\omega)\begin{pmatrix} V_x(\omega) \\ V_y(\omega) \end{pmatrix} = \begin{pmatrix} F_x(t) \\ F_y(t) \end{pmatrix}$$

This is solved for (Vx, Vy).

$$\vec{V}(\omega) = \vec{G}(\omega)\vec{F}(\omega') \quad \text{[Equation 32]}$$

Thereby, the following equation is obtained.

$$\langle v^j(\omega)v^l(\omega')\rangle > G_{jl}(\omega)G_{jm}(\omega') \langle F_l(\omega)F_m(\omega')\rangle \quad \text{[Equation 33]}$$

However, because only the portion corresponding to $\omega=\omega'=0$ relates to the diffusion coefficient, the following equation is obtained.

$$\hat{G}(\omega = 0) = \frac{1}{(\alpha D)^2 + g^2}\begin{pmatrix} \alpha D & g \\ -g & \alpha D \end{pmatrix} \quad \text{[Equation 34]}$$

$$\langle F_l(\omega)F_m(\omega')\rangle|_{\omega \to 0} = 4\pi k_B T\alpha D\delta(\omega + \omega')\delta_{lm}$$

Accordingly, the following equation is obtained.

$$\langle [x(t)]^2\rangle \underset{t\to\infty}{\sim} t\sum_{l=x,y} G_{xl}(0)G_{xl}(0) \cdot \frac{4\pi k_B T\alpha D}{(2\pi)^2} \cdot 2\pi \quad \text{[Equation 35]}$$

Also, because $$\sum_{l=x,y} G_{xl}(0)G_{xl}(0) = \frac{1}{[(\alpha D)^2 + g^2]^2}[(\alpha D)^2 + g^2] \quad \text{[Equation 36]}$$
$$= \frac{1}{[(\alpha D)^2 + g^2]}$$

the following equation is obtained.

$$\langle [x(t)]^2\rangle \underset{t\to\infty}{\sim} t2 \cdot \frac{k_B T\alpha D}{(\alpha D)^2 + g^2} = 2Dt \quad \text{[Equation 37]}$$

$$D = \frac{k_B T\alpha D}{(\alpha D)^2 + g^2}$$

Thereby, Equation 14b is derived.

Here, considering $\alpha \ll 1$ (because $\alpha$ is on the order of $10^{-2}$ to $10^{-3}$), $$D \approx \frac{k_B T \alpha D}{g^2} \quad \text{[Equation 38]}$$

About a skyrmion, it is known that $$D \sim g \sim 4\pi \quad \text{[Equation 39]}$$

In the above-mentioned explanation of the method of deriving Equation 14(b) from Equation 14, the exchange interaction J is used as the unit of energy, and the lattice spacing a to $5A=5\times 10^{-10}$ m is used as the unit of length. The results of FIG. 5 show that the diffusion constant D is proportional to $k_B T\alpha$, and Equation 6 is obtained by estimating the coefficient from the inclination of characteristics of FIG. 5.

The skyrmion driving method according to the above-mentioned embodiments utilizes electric current to make it possible to perform driving ON-OFF control at high speed and to suppress the influence of an inertial effect so that that the skyrmion driving control can be performed logically.

EXPLANATION OF REFERENCE SYMBOLS

1: skyrmion;
2: spin;
2a: circumferentially outermost spin;
2b: central spin;
10: magnetic element;
11: upstream side non-magnetic metal;
12: downstream side non-magnetic metal;
13: magnetic body;
14: power source

What is claimed is:

1. A skyrmion driving method that utilizes electric current to drive a skyrmion, the skyrmion driving method comprising: driving the skyrmion based on a driving amount proportional to a time-integrated value of an electric current density for a location R(t) of the skyrmion at a clock time t and on a driving amount that is in accordance with a diffusive motion due to thermal fluctuation and decreases as a Gilbert attenuation constant decreases.

2. The skyrmion driving method according to claim 1, wherein the driving amount proportional to the electric current is expressed by Equation 1 and the driving amount of a diffusive motion due to thermal fluctuation is expressed by Equation 2

$$R(t) - R(0) = \eta \int_0^t dt' \, j(t') \quad \text{[Equation 1]}$$

$$\langle (R(t) - R(0))^2 \rangle \approx (t/sec)\left(10^{-7}\frac{\alpha k_B T}{J}\right)[m^2] \quad \text{[Equation 2]}$$

where j(t) is an electric current density (Am$^{-2}$) at a clock time t, R(0) is a location at a clock time 0, α is a Gilbert attenuation constant, $k_B$ is a Boltzmann's constant, T is a temperature (Fahrenheit), J is an exchange interaction constant, and η is a constant that associates an electric current density with a speed.

3. The skyrmion driving method according to claim 1, wherein the skyrmion is driven by utilizing electric current at time intervals that are shorter than time intervals required for a diffusive motion of the skyrmion due to the thermal fluctuation.

4. A skyrmion driving apparatus that utilizes electric current to drive a skyrmion, wherein the skyrmion driving apparatus drives the skyrmion based on a driving amount proportional to a time-integrated value of an electric current density for a location R(t) of the skyrmion at a clock time t and on a driving amount that is in accordance with a diffusive motion due to thermal fluctuation and decreases as a Gilbert attenuation constant decreases.

5. The skyrmion driving apparatus according to claim 4, wherein the driving amount proportional to the electric current is expressed by Equation 1 and the driving amount of a diffusive motion due to thermal fluctuation is expressed by Equation 2

$$R(t) - R(0) = \eta \int_0^t dt' \, j(t') \quad \text{[Equation 1]}$$

$$\langle (R(t) - R(0))^2 \rangle \approx (t/sec)\left(10^{-7}\frac{\alpha k_B T}{J}\right)[m^2] \quad \text{[Equation 2]}$$

where j(t) is an electric current density (Am$^{-2}$) at a clock time t, R(0) is a location at a clock time 0, α is a Gilbert attenuation constant, $k_B$ is a Boltzmann's constant, T is a temperature (Fahrenheit), J is an exchange interaction constant, and η is a constant that associates an electric current density with a speed.

6. The skyrmion driving apparatus according to claim 4, wherein the skyrmion driving apparatus drives the skyrmion by utilizing electric current at time intervals that are shorter than time intervals required for a diffusive motion of the skyrmion due to the thermal fluctuation.

\* \* \* \* \*